United States Patent
Aichi

(10) Patent No.: US 8,982,315 B2
(45) Date of Patent: Mar. 17, 2015

(54) EXPOSURE APPARATUS, TEMPERATURE REGULATING SYSTEM, AND DEVICE MANUFACTURING METHOD

(75) Inventor: Shintaro Aichi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 1432 days.

(21) Appl. No.: 12/104,697

(22) Filed: Apr. 17, 2008

(65) Prior Publication Data
US 2008/0259293 A1    Oct. 23, 2008

(30) Foreign Application Priority Data
Apr. 20, 2007    (JP) .................. 2007-112294

(51) Int. Cl.
G03F 7/20    (2006.01)

(52) U.S. Cl.
CPC ........ G03F 7/70933 (2013.01); G03F 7/70858 (2013.01)
USPC .................. 355/30; 355/52; 355/53; 355/55; 355/77

(58) Field of Classification Search
CPC . G03F 7/708; G03F 7/70891; G03F 7/70883; G03F 7/70875; G03F 7/70866; G03F 7/70858
USPC ........ 355/30, 52, 53, 55, 67, 72–77; 137/334, 137/338, 339; 430/5, 8, 30, 311, 321; 250/492.1, 492.2, 492.22, 493.1, 548; 165/293
See application file for complete search history.

(56) References Cited

U.S. PATENT DOCUMENTS

| | | | | |
|---|---|---|---|---|
| 4,306,417 A * | 12/1981 | Binstock et al. | ................. | 60/676 |
| 4,916,340 A * | 4/1990 | Negishi | ....................... | 310/12.13 |
| 5,577,552 A * | 11/1996 | Ebinuma et al. | .............. | 165/296 |
| 5,654,201 A * | 8/1997 | Capuano | ....................... | 436/129 |
| 6,031,598 A * | 2/2000 | Tichenor et al. | ................. | 355/67 |
| 6,056,024 A * | 5/2000 | Noah et al. | ....................... | 141/21 |
| 6,427,462 B1 * | 8/2002 | Suenaga et al. | ................. | 62/185 |
| 6,633,364 B2 * | 10/2003 | Hayashi | ......................... | 355/53 |
| 6,829,034 B2 | 12/2004 | Miwa | | |
| 7,116,396 B2 * | 10/2006 | Tsuji et al. | ...................... | 355/30 |
| 2001/0055101 A1 * | 12/2001 | Hayashi | ......................... | 355/53 |
| 2001/0055326 A1 * | 12/2001 | Miwa et al. | ..................... | 372/57 |

(Continued)

FOREIGN PATENT DOCUMENTS

| | | |
|---|---|---|
| JP | 2001-284213 A | 10/2001 |
| JP | 2005-136004 A | 5/2005 |
| JP | 2006-080194 A | 3/2006 |

OTHER PUBLICATIONS

English translation of JP2006-080194, published Mar. 23, 2006.*

*Primary Examiner* — Christina Riddle

(74) *Attorney, Agent, or Firm* — Canon USA, Inc. IP Division

(57) ABSTRACT

An exposure apparatus which includes a plurality of units to be temperature-regulated, and transfers a pattern of a reticle onto a substrate while activating the plurality of units is disclosed. The exposure apparatus comprising a plurality of flow passages which run parallel to each other and through which a fluid to temperature-regulate the plurality of units flows, a bypass line which runs parallel to the plurality of flow passages so as to bypass the plurality of flow passages, and a flow rate controller configured to control a flow rate of fluid flowing through the bypass line, so that a total flow rate of the fluid flowing through the plurality of flow passages and the bypass line becomes a target flow rate.

10 Claims, 9 Drawing Sheets

(56) References Cited

U.S. PATENT DOCUMENTS

| | | | |
|---|---|---|---|
| 2005/0035307 A1* | 2/2005 | Verhagen | 250/492.2 |
| 2005/0168712 A1* | 8/2005 | Miyajima | 355/30 |
| 2006/0181689 A1* | 8/2006 | Phillips et al. | 355/53 |
| 2008/0055576 A1* | 3/2008 | Auer | 355/53 |

* cited by examiner

EXPOSURE APPARATUS, TEMPERATURE REGULATING SYSTEM, AND DEVICE MANUFACTURING METHOD

BACKGROUND OF THE INVENTION

1. Field of the Invention

The present invention relates to an exposure apparatus, a temperature regulating system, and a device manufacturing method.

2. Description of the Related Art

An exposure apparatus is used to manufacture an electronic device such as a semiconductor device or liquid crystal display device. The exposure apparatus projects the pattern of a reticle onto a substrate coated with a photosensitive agent (photoresist), thereby exposing the photosensitive agent.

The exposure apparatus includes a plurality of units. A temperature-regulated fluid is supplied to the units to temperature-regulate them (see Japanese Patent Laid-Open No. 2005-136004).

FIG. 2 is a block diagram showing the schematic arrangement of a conventional temperature regulating system. A liquid pressurized by a pump 101 is temperature-regulated by a temperature regulating unit 102, and supplied to units 105a to 105e via a circulating line 120 and branching portion 107. Flow rate regulating valves 104a to 104e and flow rate sensors 106a to 106e are inserted into the flow passages of the units 105a to 105e. The flow rate regulating valves 104a to 104e control the flow rates of fluid components flowing through the units 105a to 105e, so that each of the flow rate sensors 106a to 106e indicates a target value. At this time, a shutoff valve 103g connected to a bypass line 129 is fully closed, and shutoff valves 103f and 103h connected to the circulating line 120 and a circulating line 121 are fully open.

The fluid components remove heat generated by the units 105a to 105e, and merge with each other at a confluence portion 108. The fluid components then return into a tank 100 via the circulating line 121. A flow rate sensor 106f for detecting the total flow rate of the fluid is connected to the circulating line 121.

Assume that liquid supply to only a unit to be maintained or replaced is stopped. Since the conventional temperature regulating system is a parallel system, it loses the flow rate balance and therefore supplies a liquid in larger amounts than before to other units. In this case, the pressures that act on the entrances of the other units rise, so they may exceed withstand pressures.

In the maintenance work or replacement work, the pump 101 must be stopped or all the fluid must be bypassed via the bypass line 129 by closing the shutoff valves 103f and 103h and opening the shutoff valve 103g.

SUMMARY OF THE INVENTION

The present invention has been made in consideration of the above-described problem, and has as its object to facilitate the regulation of the flow rate of a fluid supplied to a plurality of flow passages running parallel to each other in an arrangement which temperature-regulates a plurality of units by, e.g., supplying a fluid to the individual flow passages.

According to one aspect of the present invention, there is provided an exposure apparatus which includes a plurality of units to be temperature-regulated, and transfers a pattern of a reticle onto a substrate while activating the plurality of units, the exposure apparatus comprising a plurality of flow passages which run parallel to each other and through which a fluid to temperature-regulate the plurality of units flows, a bypass line which runs parallel to the plurality of flow passages so as to bypass the plurality of flow passages, and a flow rate controller configured to control a flow rate of fluid flowing through the bypass line, so that a total flow rate of the fluid flowing through the plurality of flow passages and the bypass line becomes a target flow rate.

According to the present invention, it is possible to facilitate the regulation of the flow rate of a fluid supplied to a plurality of flow passages running parallel to each other in an arrangement which temperature-regulates a plurality of units by, e.g., supplying a fluid to the individual flow passages.

Further features of the present invention will become apparent from the following description of exemplary embodiments with reference to the attached drawings.

DESCRIPTION OF THE EMBODIMENTS

Preferred embodiments of the present invention will be described below with reference to the accompanying drawings.

Figure 1:
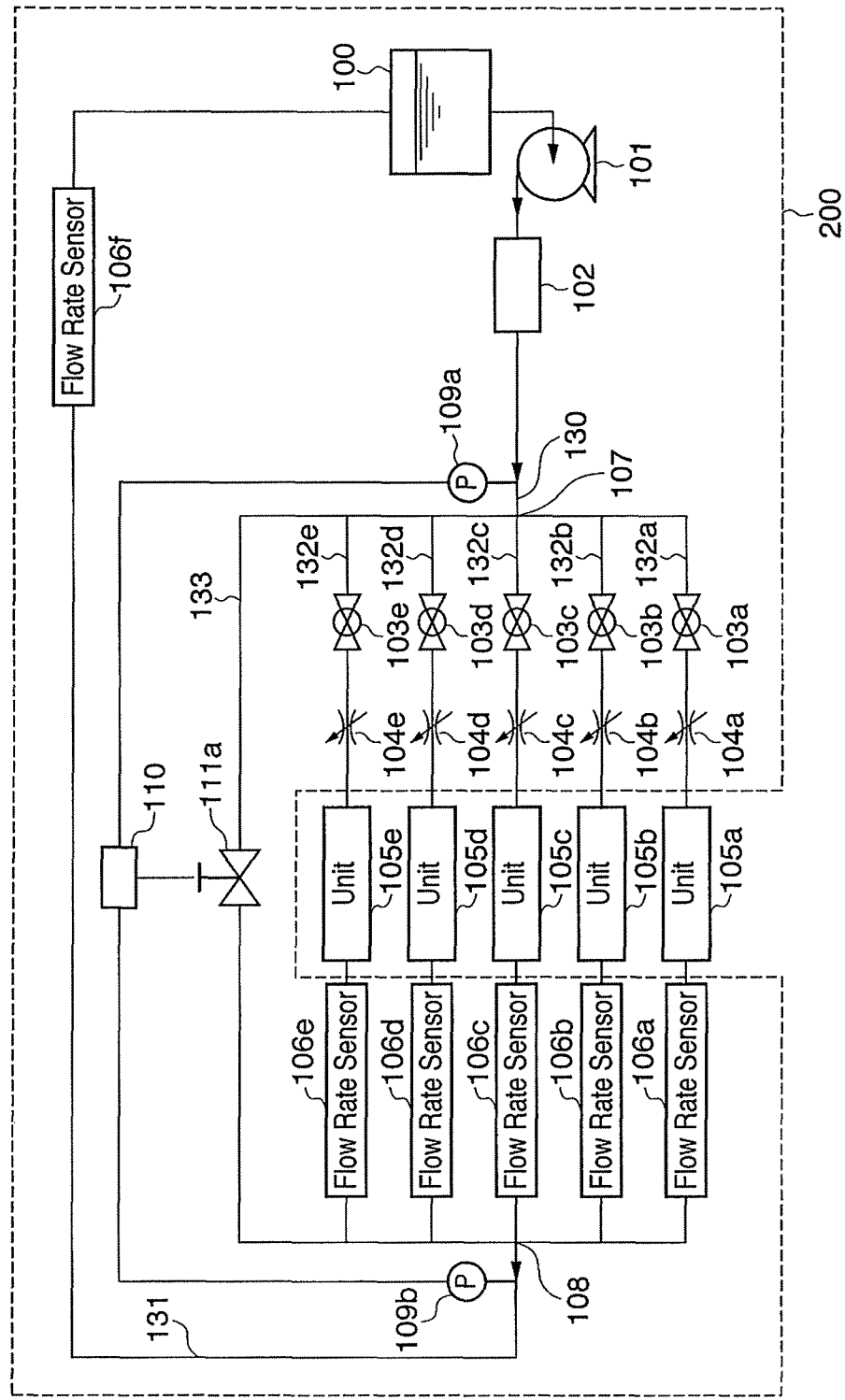
FIG. 1 is a block diagram showing the schematic arrangement of a temperature regulating system according to the first embodiment of the present invention.
Figure 2:
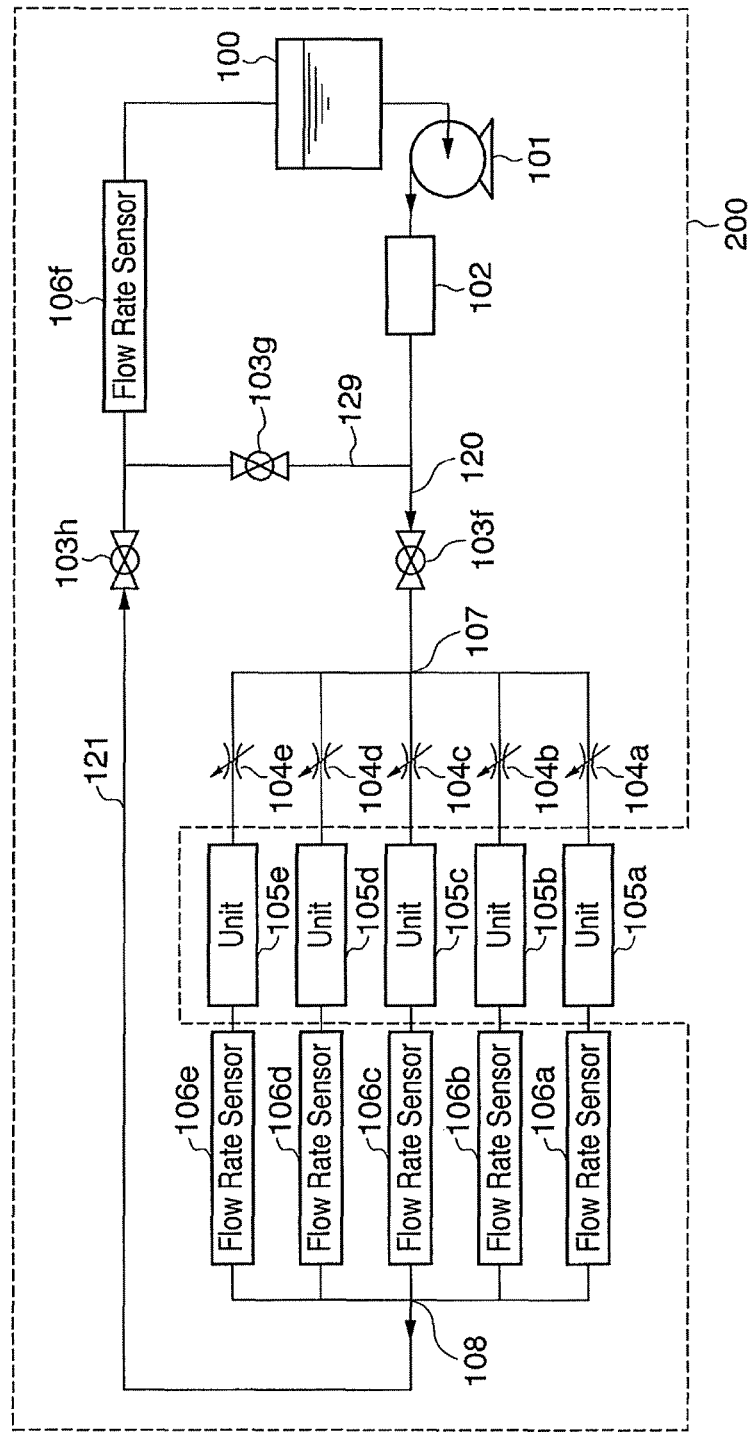
FIG. 2 is a block diagram showing the schematic arrangement of a conventional temperature regulating system.

FIG. 1 is a block diagram showing the schematic arrangement of a temperature regulating system according to the first embodiment of the present invention. A temperature regulating system 200 according to a preferred embodiment of the present invention can temperature-regulate a plurality of units 105a to 105e. The plurality of units 105a to 105e are suitable as constituent components of an exposure apparatus used in lithography to manufacture a device such as a semiconductor integrated circuit device or a liquid crystal display device. In other words, the temperature regulating system 200 according to the preferred embodiment of the present invention is suitable to cool the constituent components of the exposure apparatus.

A fluid pressurized by a pump 101 is temperature-regulated by a temperature regulating unit 102, and supplied to flow passages 132a to 132e of the units 105a to 105e via a circulating line 130 and branching portion 107. The temperature regulating unit 102 includes, e.g., a cooler, heater, heat exchanger, and temperature sensor, and maintains the fluid at a target temperature.

Shutoff valves 103a to 103e, flow rate regulating valves 104a to 104e, and flow rate sensors 106a to 106e are inserted into the flow passages 132a to 132e of the units 105a to 105e. The flow rates of fluid components supplied to the units 105a to 105e can be regulated by controlling the flow rate regulating valves 104a to 104e so that each of the flow rate sensors 106a to 106e indicates a target flow rate.

The flow passages 132a to 132e are connected parallel to each other between the branching portion 107 and a confluence portion 108. The fluid components remove heat generated by the units 105a to 105e while flowing through the flow passages 132a to 132e, and merge with each other at the confluence portion 108. The fluid components then return into a tank 100 via a circulating line 131. A flow rate sensor 106f for detecting the total flow rate is connected to the circulating line 131.

A first pressure sensor 109a is connected upstream (circulating line 130) of the branching portion 107. A second pressure sensor 109b is connected downstream (circulating line 131) of the confluence portion 108. A bypass line 133 runs parallel to the flow passages 132a to 132e of the units 105a to 105e so as to bypass the flow passages 132a to 132e. A flow rate regulating valve 111a is connected to the bypass line 133.

A controller 110 controls the opening degree of the flow rate regulating valve 111a on the basis of the pressures detected by the first pressure sensor 109a and second pressure sensor 109b. At this time, the controller 110 controls the opening degree of the flow rate regulating valve 111a so that the difference between the pressures detected by the first pressure sensor 109a and second pressure sensor 109b takes a target value (e.g., a nearly constant value). This amounts to controlling the flow rate of a fluid component flowing through the bypass line 133, so that the total flow rate of the fluid flowing through the flow passages 132a to 132e and bypass line 133 becomes a target flow rate (e.g., a nearly constant value). The first pressure sensor 109a, second pressure sensor 109b, controller 110, and flow rate regulating valve 111a constitute a flow rate controller for controlling the total flow rate of the fluid.

The temperature regulating system 200 can be regulated after an apparatus such as an exposure apparatus to be temperature-regulated by the temperature regulating system 200 is installed at an appropriate place. This regulation can include the regulation of the flow rates of the fluid components supplied to the flow passages 132a to 132e of the units 105a to 105e.

A flow rate regulation method will be exemplified below. First, a fluid is supplied to the bypass line 133 at a predetermined total flow rate while all the shutoff valves 103a to 103e inserted into the flow passages 132a to 132e, respectively, are kept closed. The controller 110 automatically controls the flow rate regulating valve 111a of the bypass line 133 so that the difference (to be referred to as a differential pressure hereinafter) between the pressure of the fluid at the branching portion 107 detected by the first pressure sensor 109a and that at the confluence portion 108 detected by the second pressure sensor 109b is kept nearly constant.

In this state, the shutoff valves 103a to 103e inserted into the flow passages 132a to 132e of the units 105a to 105e are opened. The flow rate regulating valves 104a to 104e regulate the flow rates of the fluid components supplied to the units 105a to 105e. At this time, since the flow rate regulating valve 111a controls the differential pressure to be nearly constant, the total flow rate of the fluid flowing through the circulating lines 130 and 131 is kept nearly constant.

Figure 8:
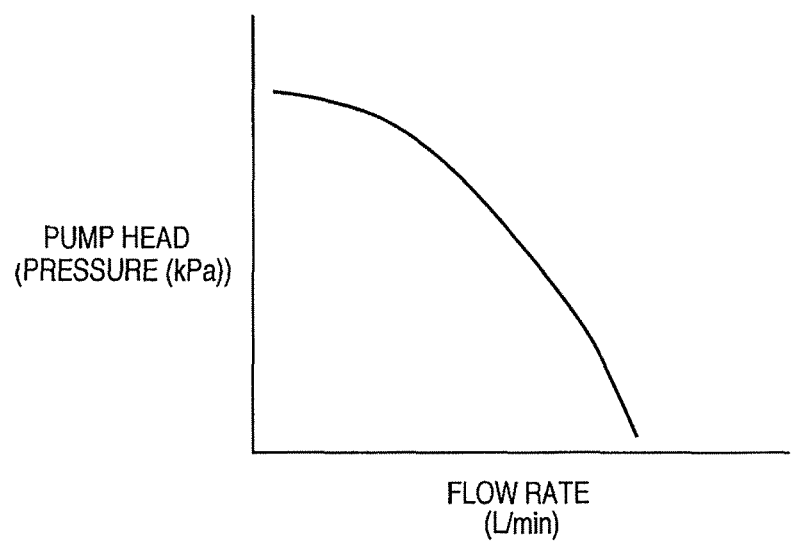
FIG. 8 is a graph illustrating the characteristic (head-capacity curve) of a general pump.

The relationship between the differential pressure and the flow rate will be explained hereinafter. FIG. 8 is a graph illustrating the characteristic (head-capacity curve) of a general pump. The abscissa indicates the flow rate, and the ordinate indicates the pump head (pressure). At a certain operating frequency, the characteristic curve as shown in FIG. 8 is obtained, in which the flow rate and the pressure have a one-to-one relationship. In other words, the total flow rate is kept nearly constant by controlling the flow rate regulating valve 111a of the bypass line 133 so that the differential pressure (the differential pressure between the entrance and exit of each unit) between the branching portion 107 and the confluence portion 108 takes a nearly constant value.

Even when the flow rate of a fluid component flowing through a given unit is regulated, the differential pressure between the branching portion 107 and the confluence portion 108 is controlled to be kept nearly constant. For this reason, the flow rate of a fluid component flowing through a unit which has already undergone flow rate regulation never fluctuates. This obviates the need for regulating again the flow passage of a unit which has already undergone flow rate regulation, thus shortening the overall regulation work time.

When a need arises for maintaining/replacing a given unit, a shutoff valve which controls fluid supply to the unit which requires maintaining/replacing is closed while the differential pressure is controlled by the flow rate regulating valve 111a. Even when a specific shutoff valve is closed, the flow rate of a fluid component flowing through a unit for which a shutoff valve is not closed is kept nearly constant. Therefore, even when a specific shutoff valve is closed, a unit in which a shutoff valve is not closed continues to be temperature-regulated.

Figure 3:
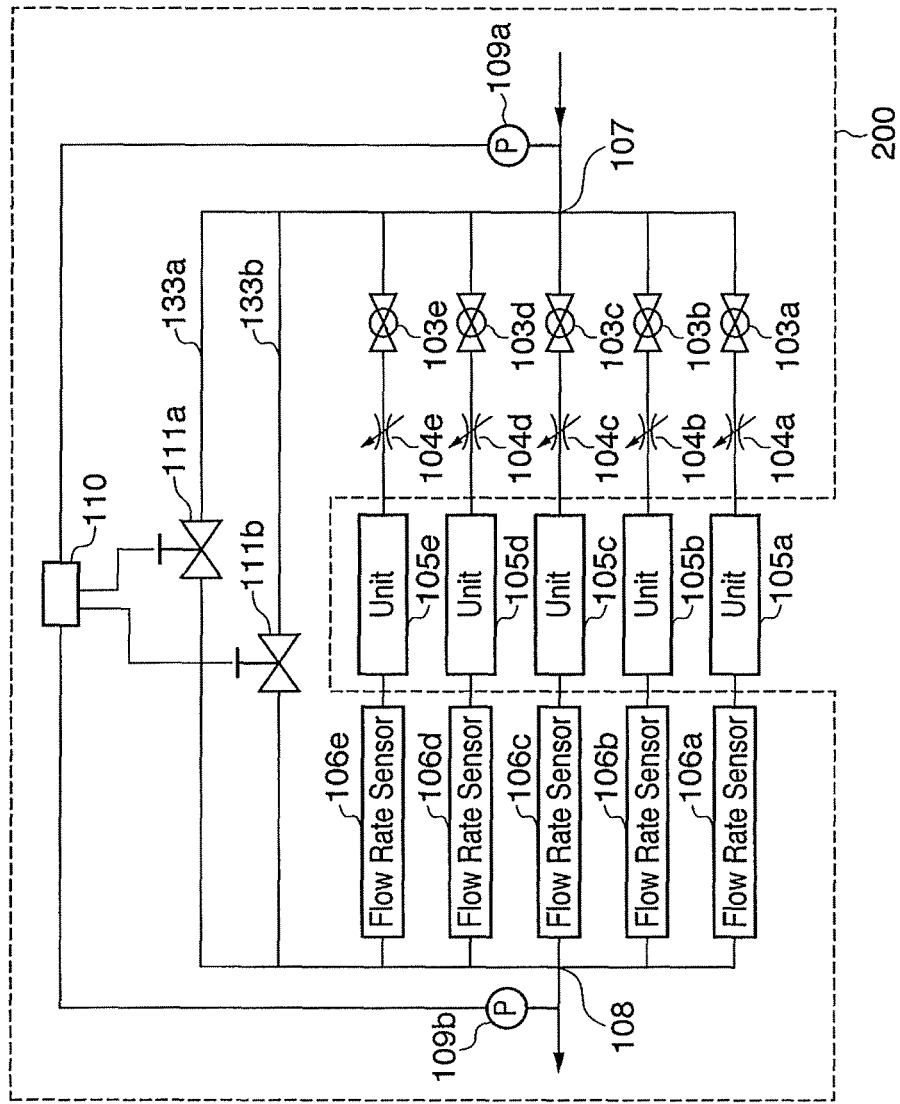
FIG. 3 is a block diagram showing the schematic arrangement of a temperature regulating system according to the second embodiment of the present invention.

FIG. 3 is a block diagram showing the schematic arrangement of a temperature regulating system according to the second embodiment of the present invention. In the second embodiment, two bypass lines 133a and 133b are provided to the temperature regulating system. Flow rate regulating valves 111a and 111b are connected to the bypass lines 133a and 133b, respectively. Other parts in the second embodiment are the same as in the first embodiment. A controller 110 controls the flow rate regulating valves 111a and 111b so that the difference between the pressure of the fluid at a branching portion 107 detected by a pressure sensor 109a and that at a confluence portion 108 detected by a pressure sensor 109b takes a nearly constant value.

Cavitation may occur at a specific valve opening degree and in a specific differential pressure state depending on the valve characteristic. To prevent such a troublesome operating state, it is effective to use two bypass lines as described above or three or more bypass lines.

Figure 4:
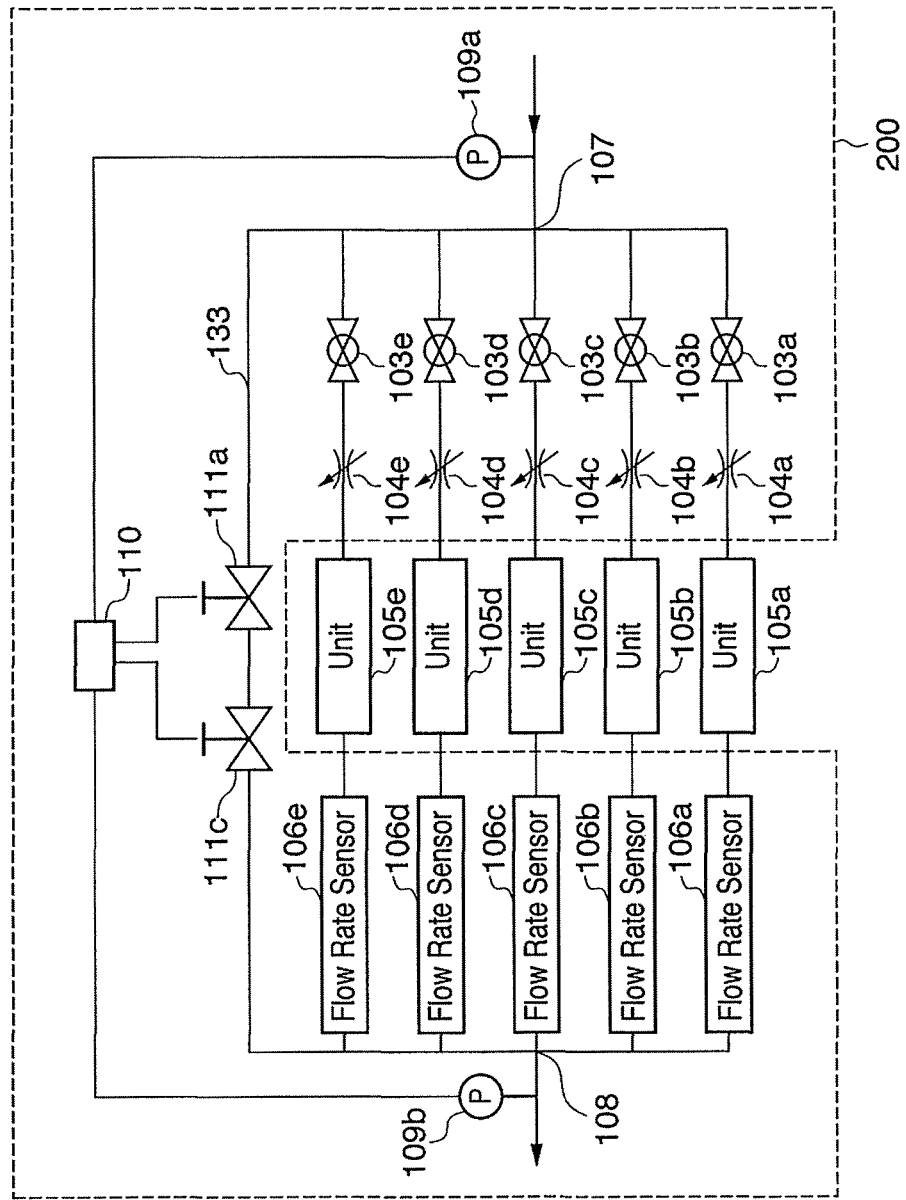
FIG. 4 is a block diagram showing the schematic arrangement of a temperature regulating system according to the third embodiment of the present invention.

FIG. 4 is a block diagram showing the schematic arrangement of a temperature regulating system according to the third embodiment of the present invention. In the third embodiment, a flow rate regulating valve 111c is additionally connected to a bypass line 133. Other parts in the third embodiment are the same as in the first embodiment.

Cavitation may occur at a specific valve opening degree and in a specific differential pressure state depending on the valve characteristic. To prevent such a troublesome operating state, it is effective to connect two flow rate regulating valves 111a and 111c to the bypass line 133 as described above or connect three or more flow rate regulating valves to it.

Figure 5:
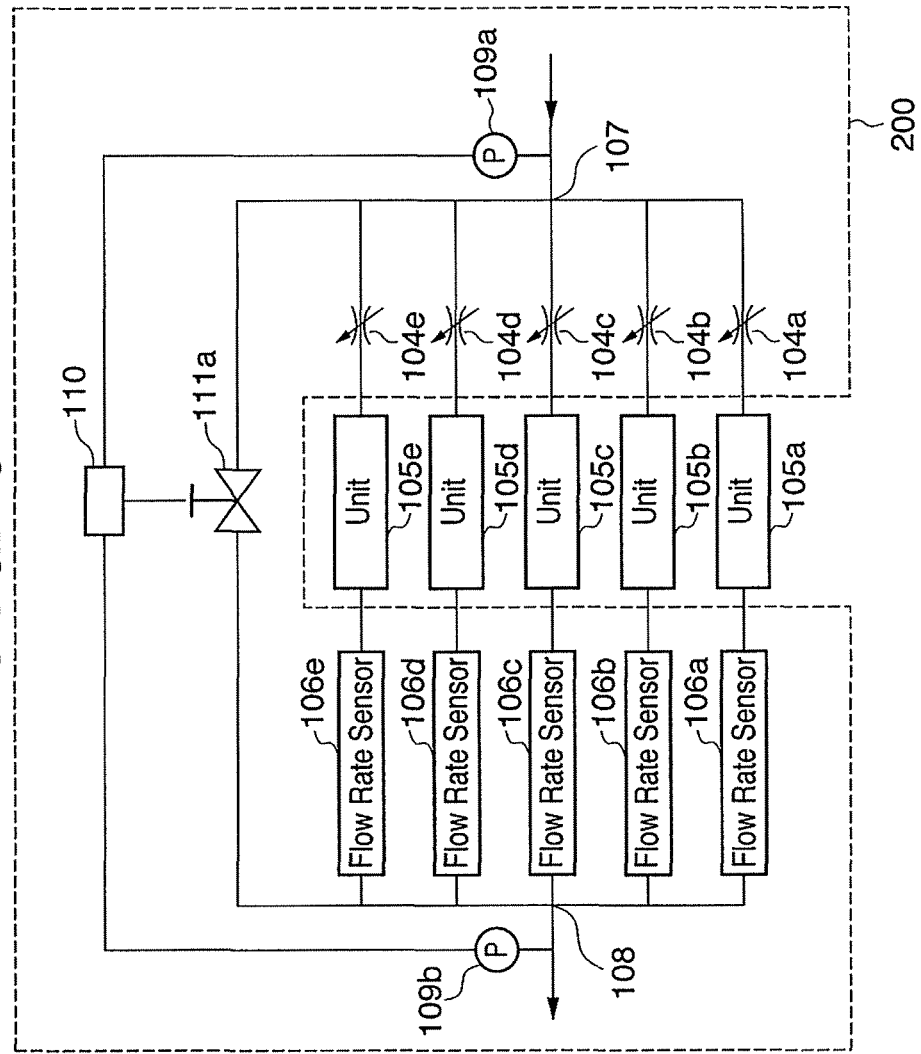
FIG. 5 is a block diagram showing the schematic arrangement of a temperature regulating system according to the fourth embodiment of the present invention.

FIG. 5 is a block diagram showing the schematic arrangement of a temperature regulating system according to the fourth embodiment of the present invention. The fourth embodiment exemplifies a case in which a flow rate regulating valve also serves as a shutoff valve to be inserted into the flow passage of each unit. The shutoff valves can be omitted as long as flow rate regulating valves 104a to 104e are capable of shutting off the flow passages. Other parts in the fourth embodiment are the same as in the first embodiment.

Figure 6:
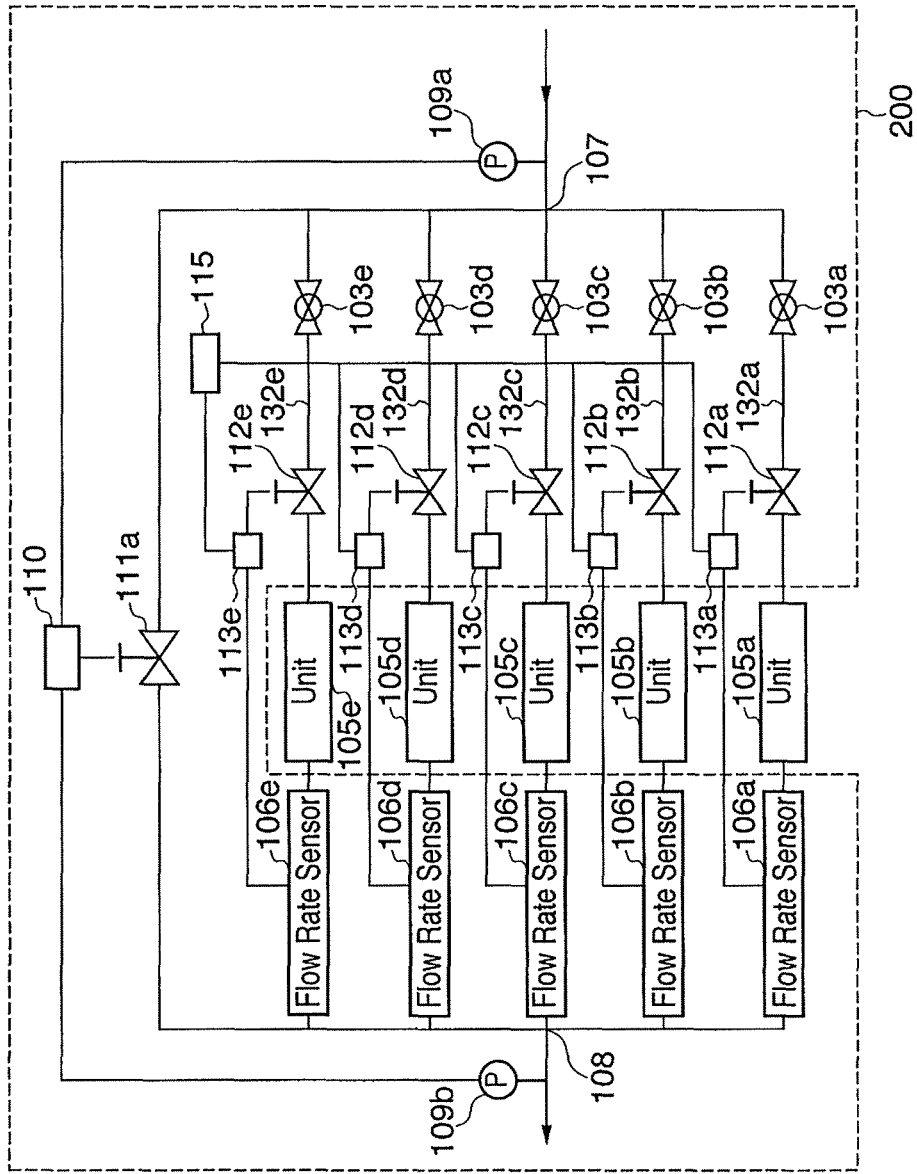
FIG. 6 is a block diagram showing the schematic arrangement of a temperature regulating system according to the fifth embodiment of the present invention.

FIG. 6 is a block diagram showing the schematic arrangement of a temperature regulating system according to the fifth embodiment of the present invention. The fifth embodiment exemplifies a case in which flow rate regulating valves 112a to 112e inserted into flow passages 132a to 132e of units 105a to 105e are automatically controlled. Automatic control valves are used as the flow rate regulating valves 112a to 112e. Individual controllers 113a to 113e for feeding back the values indicated by flow rate sensors 106a to 106e are provided to the flow rate regulating valves 112a to 112e. This makes it possible to automatically regulate the flow rates of fluid components flowing through the units 105a to 105e.

In the fifth embodiment, when all the individual controllers 113a to 113e are simultaneously activated to perform flow rate regulation at the start, they may transiently interfere with each other. To solve this problem, a systematic controller 115 for systematically controlling the individual controllers 113a to 113e is preferably provided to the temperature regulating system, thereby controlling the activation order of the individual controllers 113a to 113e.

The shutoff valves 103a to 103e can be omitted as long as each flow rate regulating valve has a function of shutting off the flow passage, as described in the fourth embodiment.

Figure 7:
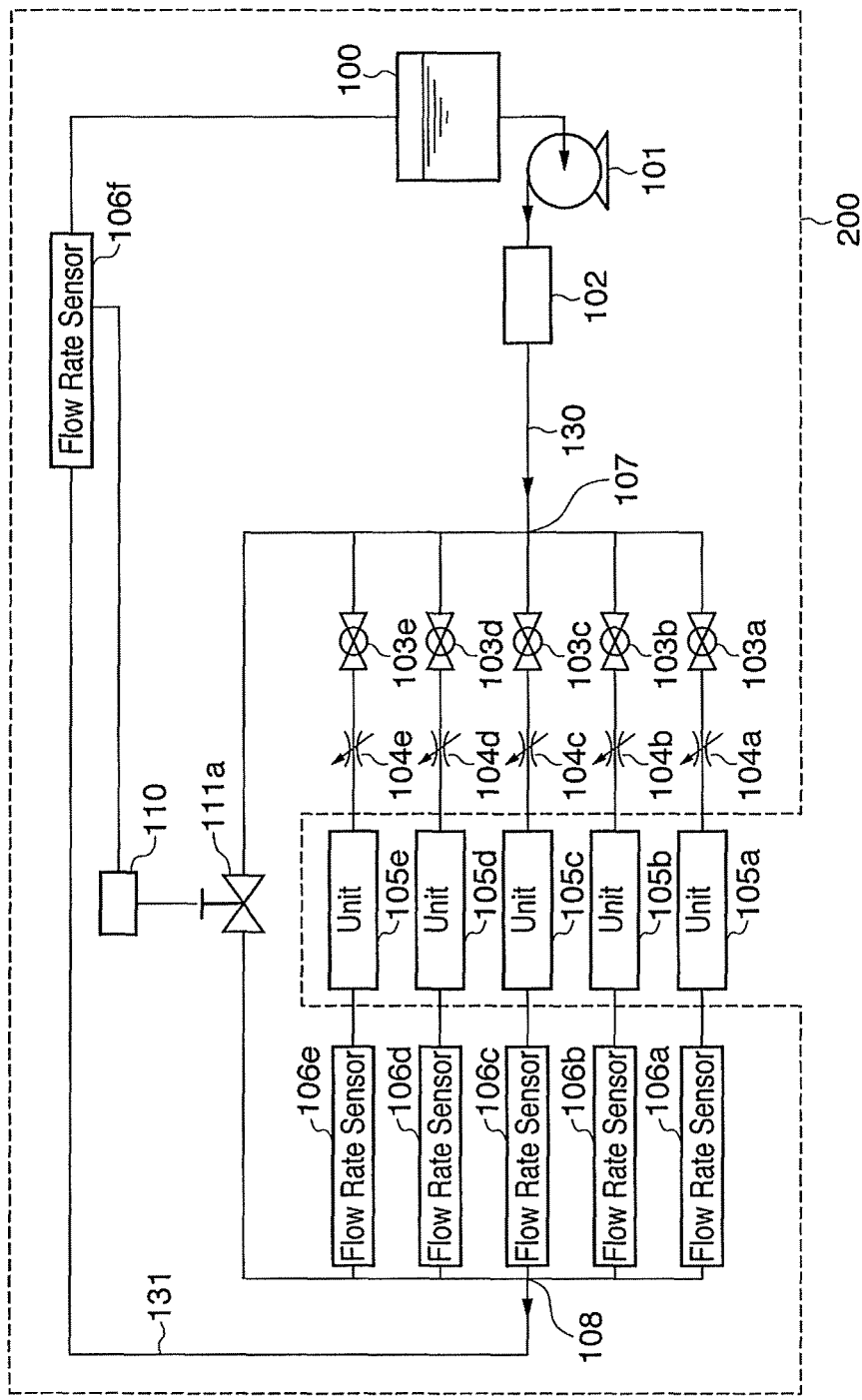
FIG. 7 is a block diagram showing the schematic arrangement of a temperature regulating system according to the sixth embodiment of the present invention.

FIG. 7 is a block diagram showing the schematic arrangement of a temperature regulating system according to the sixth embodiment of the present invention. In the sixth embodiment, a flow rate sensor 106f detects the flow rate of a fluid flowing through a circulating line 131. On the basis of the detected flow rate, a controller 110 performs feedback control of the opening degree of a flow rate regulating valve 111a.

The shutoff valves 103a to 103e can be omitted as long as each flow rate regulating valve has a function of shutting off the flow passage, as described in the fourth embodiment.

Figure 9:
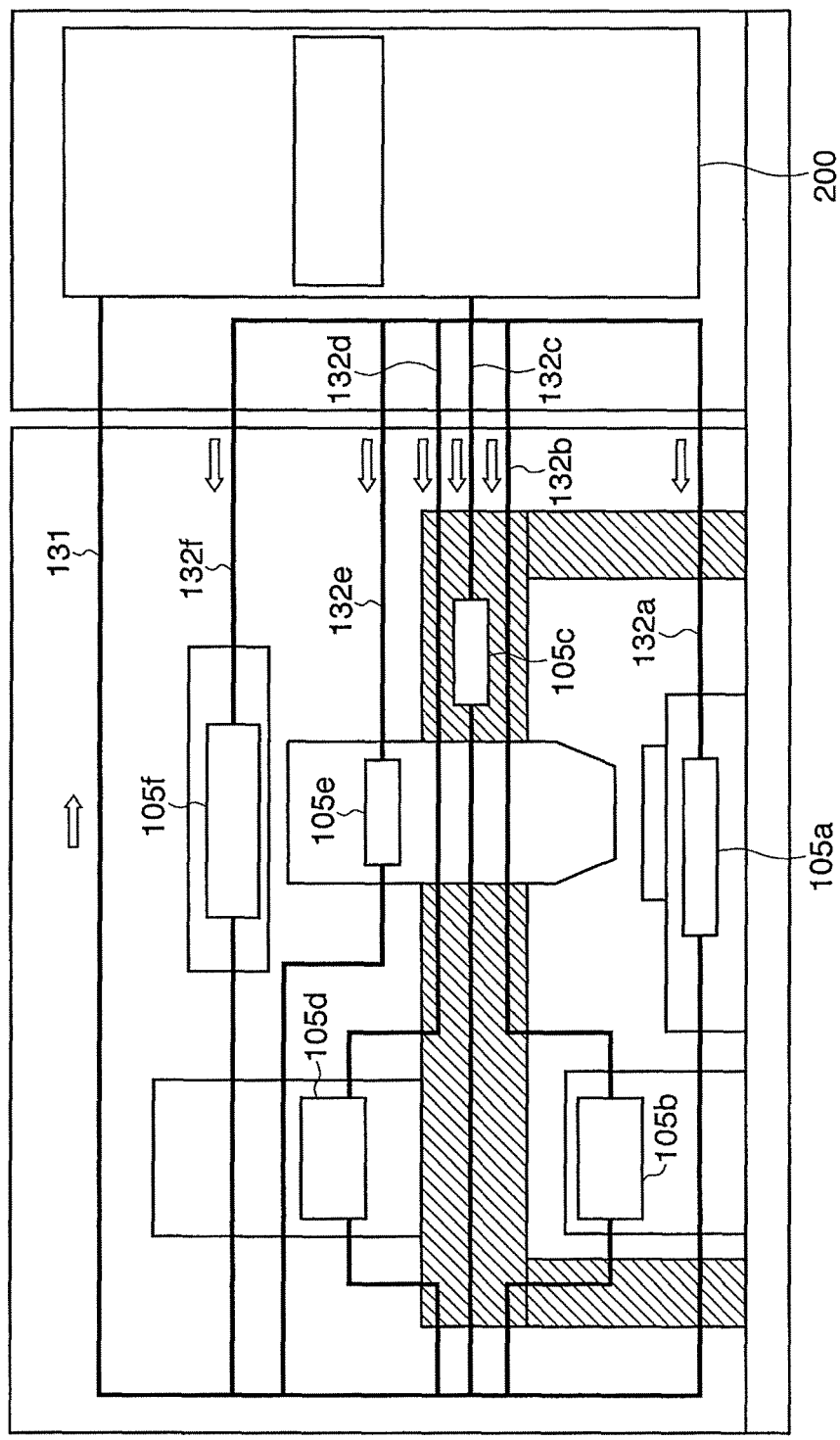
FIG. 9 is a view showing the schematic arrangement of an exposure apparatus according to a preferred embodiment of the present invention.

FIG. 9 is a view showing the schematic arrangement of an exposure apparatus according to a preferred embodiment of the present invention. The exposure apparatus incorporates a temperature regulating system 200 represented by those according to the above-described embodiments. The exposure apparatus comprises a plurality of units to be temperature-regulated, and transfers the pattern of a reticle onto a substrate while activating the plurality of units. The plurality of units can include, e.g., a substrate stage mechanism 105a, substrate conveying mechanism 105b, frame 105c, reticle conveying mechanism 105d, projection optical system 105e, and reticle stage mechanism 105f.

Referring to FIG. 9, flow passages 132a to 132f are concrete examples of the flow passages 132a to 132e in the above-described embodiments. The substrate stage mechanism 105a, substrate conveying mechanism 105b, frame 105c, reticle conveying mechanism 105d, projection optical system 105e, and reticle stage mechanism 105f are concrete examples of the units 105a to 105e in the above-described embodiments. Flow rate regulating valves, flow rate sensors, and shutoff valves to be inserted into the flow passages 132a to 132e are not illustrated in FIG. 9. The shutoff valves can be omitted as long as each flow rate regulating valve has a function of shutting off the flow passage, as described in the fourth embodiment.

The frame 105c supports the substrate stage mechanism 105a, substrate conveying mechanism 105b, reticle conveying mechanism 105d, and projection optical system 105e. The reticle conveying mechanism 105d conveys a reticle to the reticle stage mechanism 105f. The reticle stage mechanism 105f holds and aligns the reticle. The substrate conveying mechanism 105b conveys a substrate coated with a photosensitive agent to the substrate stage mechanism 105a. The substrate stage mechanism 105a holds and aligns the substrate. The pattern of the reticle is projected onto the substrate via the projection optical system 105e, and transferred onto the photosensitive agent on the substrate.

A device (e.g., a semiconductor integrated circuit device or liquid crystal display device) is manufactured by an exposure step of exposing a substrate coated with a photosensitive agent to light using the exposure apparatus according to the above-described embodiment, a development step of developing the photosensitive agent, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-112294, filed Apr. 20, 2007, which is hereby incorporated by reference herein in its entirety.

What is claimed is:

1. A method of regulating a temperature regulating system which temperature-regulates a plurality of units of an exposure apparatus which transfers a pattern of a reticle onto a substrate while activating the plurality of units, the system comprising:
    a plurality of flow passages which run parallel to each other and through which a fluid to temperature-regulate the plurality of units flows;
    a plurality of valves respectively provided to the plurality of flow passages;
    a bypass line which runs parallel to the plurality of flow passages so as to bypass the plurality of flow passages; and
    a flow rate controller configured to control a flow rate of fluid flowing through the bypass line, so that a total flow rate of the fluid flowing through the plurality of flow passages and the bypass line becomes a target flow rate,
    the method comprising:
    a step of opening all of the plurality of valves respectively provided to the plurality of flow passages to temperature-regulate the plurality of units; and
    a step of, when a given unit of the plurality of units is maintained and/or replaced, closing a valve of the plurality of valves, which is provided to a flow passage of the plurality of flow passages, for temperature-regulating the given unit while keeping the valves provided to the flow passages for temperature-regulating the units of the plurality of units, other than the given unit in an opened state to flow the fluid through the opened valves, in a state that the flow rate controller controls the flow rate of the fluid flowing through the bypass line so that the total flow rate of the fluid flowing through the plurality of flow passages and the bypass line becomes the target flow rate.

2. The method according to claim 1, wherein the flow rate controller is configured to control the flow rate of the fluid flowing through the bypass line, so that the total flow rate of the fluid flowing through the plurality of flow passages and the bypass line takes a substantially constant value.

3. The method according to claim 1, wherein
the plurality of flow passages and the bypass line are branched at a branching portion and merge with each other at a confluence portion, and
the flow rate controller controls the flow rate of the fluid flowing through the bypass line, so that a difference between a pressure of the fluid upstream of the branching portion and a pressure of the fluid downstream of the confluence portion takes a substantially constant value.

4. The method according to claim 3, wherein
the flow rate controller includes a first pressure sensor configured to detect a pressure of the fluid upstream of the branching portion, and a second pressure sensor configured to detect a pressure of the fluid downstream of the confluence portion, and
the flow rate controller is configured to control the flow rate of the fluid flowing through the bypass line based on the pressures detected by the first pressure sensor and the second pressure sensor.

5. The method according to claim 1, wherein
the flow controller includes a flow rate sensor configured to detect the total flow rate of the fluid flowing through the plurality of flow passages and the bypass line, and
the flow rate controller is configured to control the flow rate of the fluid flowing through the bypass line based on the total flow rate detected by the flow rate sensor.

6. The method according to claim 1, further comprising supplying the fluid to the bypass line at a predetermined total flow rate while the plurality of valves inserted into the plurality of flow passages are shutoff, respectively.

7. The method according to 1, wherein the plurality of units include one of a substrate stage mechanism, a substrate conveying mechanism, a projection optical system and a reticle stage mechanism.

8. A method of regulating a temperature regulating system, the system comprising:
a plurality of flow passages which run parallel to each other and through which a fluid to temperature-regulate a plurality of units flows;
a plurality of valves respectively provided to the plurality of flow passages;
a bypass line which runs parallel to the plurality of flow passages so as to bypass the plurality of flow passages; and
a flow rate controller which controls a flow rate of fluid flowing through the bypass line, so that a total flow rate of the fluid flowing through the plurality of flow passages and the bypass line becomes a target flow rate,
the method comprising:
a step of opening all of the plurality of valves respectively provided to the plurality of flow passages to temperature-regulate the plurality of units; and
a step of, when a given unit of the plurality of units is maintained and/or replaced, closing a valve of the plurality of valves, which is provided to a flow passage of the plurality of flow passages, for temperature-regulating the given unit while keeping the valves provided to the flow passages for temperature-regulating the units of the plurality of units, other than the given unit in an opened state to flow the fluid through the opened valves, in a state that the flow rate controller controls the flow rate of the fluid flowing through the bypass line so that the total flow rate of the fluid flowing through the plurality of flow passages and the bypass line becomes the target flow rate.

9. The method according to claim 8, further comprising supplying the fluid to the bypass line at a predetermined total flow rate while the plurality of valves inserted into the plurality of flow passages are shutoff, respectively.

10. The method according to 8, wherein the plurality of units include one of a substrate stage mechanism, a substrate conveying mechanism, a projection optical system and a reticle stage mechanism.

* * * * *